(12) United States Patent
Shin et al.

(10) Patent No.: US 11,605,694 B2
(45) Date of Patent: Mar. 14, 2023

(54) DISPLAY APPARATUS INCLUDING A PLANARIZATION LAYER HAVING A RECESS AROUND A UNIT DISPLAY PORTION

(71) Applicant: Samsung Display Co., Ltd., Yongin-si (KR)

(72) Inventors: Hosik Shin, Yongin-si (KR); Junhyeong Park, Yongin-si (KR); Jaemin Shin, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 22 days.

(21) Appl. No.: 16/838,296

(22) Filed: Apr. 2, 2020

(65) Prior Publication Data

US 2020/0328269 A1 Oct. 15, 2020

(30) Foreign Application Priority Data

Apr. 9, 2019 (KR) .................. 10-2019-0041496

(51) Int. Cl.
*H01L 27/32* (2006.01)
*H01L 51/52* (2006.01)
*H01L 51/56* (2006.01)

(52) U.S. Cl.
CPC ...... *H01L 27/3276* (2013.01); *H01L 27/3246* (2013.01); *H01L 51/524* (2013.01); *H01L 51/56* (2013.01); *H01L 2251/301* (2013.01)

(58) Field of Classification Search
None
See application file for complete search history.

(56) References Cited

U.S. PATENT DOCUMENTS

| | | | |
|---|---|---|---|
| 6,866,901 B2 | 3/2005 | Burrows et al. | |
| 10,038,163 B2 | 7/2018 | Kim et al. | |
| 10,693,091 B2 | 6/2020 | Kim et al. | |
| 2003/0203210 A1 | 10/2003 | Graff et al. | |
| 2014/0151653 A1* | 6/2014 | Kim | H01L 27/3258 257/40 |
| 2016/0190389 A1* | 6/2016 | Lee | H01L 51/0097 438/28 |
| 2016/0359142 A1* | 12/2016 | Huangfu | H01L 51/001 |
| 2017/0033312 A1* | 2/2017 | Kim | H01L 27/3276 |
| 2017/0249886 A1 | 8/2017 | Choi | |
| 2017/0271421 A1* | 9/2017 | Jinbo | H01L 27/3258 |

(Continued)

FOREIGN PATENT DOCUMENTS

CN 108520895 A 9/2018
CN 108832022 A 11/2018

(Continued)

*Primary Examiner* — Erik Kielin
(74) *Attorney, Agent, or Firm* — Lewis Roca Rothgerber Christie LLP

(57) ABSTRACT

A display apparatus includes: a substrate; a plurality of unit display portions, each including a thin film transistor located on the substrate and including at least one inorganic layer, a display element electrically connected to the thin film transistor, and a planarization layer located between the thin film transistor and the display element; and an encapsulation layer sealing each of the plurality of unit display portions, the planarization layer including a recess that is concave in a depth direction from a side of the display element.

21 Claims, 8 Drawing Sheets

(56) References Cited

U.S. PATENT DOCUMENTS

| | | | |
|---|---|---|---|
| 2017/0278920 A1* | 9/2017 | Park | H01L 27/3258 |
| 2018/0033998 A1* | 2/2018 | Kim | H01L 51/5253 |
| 2018/0083072 A1* | 3/2018 | Kwon | H01L 27/3211 |
| 2018/0090699 A1* | 3/2018 | Shin | H01L 51/0097 |
| 2018/0158887 A1* | 6/2018 | Yun | H01L 51/5209 |
| 2019/0058022 A1* | 2/2019 | Baik | H01L 51/5278 |
| 2019/0096971 A1* | 3/2019 | Ukigaya | H01L 51/5056 |
| 2020/0203640 A1* | 6/2020 | Yang | H01L 27/3258 |

FOREIGN PATENT DOCUMENTS

| | | |
|---|---|---|
| CN | 108987444 A | 12/2018 |
| KR | 10-2017-0100719 A | 9/2017 |
| KR | 10-2017-0113934 A | 10/2017 |
| KR | 10-2019-0078723 A | 7/2019 |

\* cited by examiner

DISPLAY APPARATUS INCLUDING A PLANARIZATION LAYER HAVING A RECESS AROUND A UNIT DISPLAY PORTION

CROSS-REFERENCE TO RELATED APPLICATION

This application claims priority to and the benefit of Korean Patent Application No. 10-2019-0041496, filed on Apr. 9, 2019 in the Korean Intellectual Property Office, the disclosure of which is incorporated herein in its entirety by reference.

BACKGROUND

1. Field

Aspects of one or more embodiments relate to a display apparatus.

2. Description of the Related Art

According to the rapid development of a display field in which various electrical signal information is visually expressed, various plane display apparatuses having extraordinary properties, such as small thickness, light weight, and low power consumption, are being introduced. Recently, along with the development of display-related technologies, flexible display apparatuses that may be bent or rolled are being researched and developed. Further, research into and development of a stretchable display apparatus that may be modified into various shapes are being actively performed.

Meanwhile, a display apparatus having a small thickness and flexibility may include a thin-film type encapsulation layer to block permeation of external moisture or oxygen. Generally, a thin film encapsulation layer may have a structure in which inorganic layers and organic layers are alternately stacked. However, thin film encapsulation layers according to the related art, which are formed in an entire area of the display apparatus, may decrease the flexibility of the display apparatus, and the thin film encapsulation layer may be damaged when the shape of the display apparatus is modified.

SUMMARY

According to an aspect of one or more embodiments, a display apparatus, a shape of which may be modified, is provided.

Additional aspects will be set forth, in part, in the description which follows and, in part, will be apparent from the description, or may be learned by practice of the presented embodiments.

According to one or more embodiments, a display apparatus includes: a substrate; a plurality of unit display portions, each including a thin film transistor located on the substrate, a display element electrically connected to the thin film transistor, and a planarization layer located between the thin film transistor and the display element; and an encapsulation layer sealing each of the plurality of unit display portions, wherein the planarization layer includes a recess that is concave in a depth direction from a side of the display element.

In an embodiment, the recess may at least partially surround the display element.

In an embodiment, each of the plurality of unit display portions may include a plurality of display elements, and the recess may surround the plurality of display elements.

In an embodiment, the encapsulation layer may include an organic encapsulation layer, a first inorganic encapsulation layer arranged under the organic encapsulation layer, and a second inorganic encapsulation layer arranged over the organic encapsulation layer, the organic encapsulation layer includes unit organic encapsulation layers respectively corresponding to the plurality of unit display portions, and the first inorganic encapsulation layer and the second inorganic encapsulation layer may be in contact with each other at a perimeter of the unit organic encapsulation layers.

In an embodiment, the substrate includes a plurality of islands apart from one another, a plurality of connection portions connecting the plurality of islands, and a plurality of penetration portions penetrating the substrate between the plurality of connection portions, and the plurality of unit display portions may be respectively arranged on the plurality of islands.

In an embodiment, the first inorganic encapsulation layer and the second inorganic encapsulation layer may be in contact on the plurality of connection portions.

In an embodiment, the first inorganic encapsulation layer and the second inorganic encapsulation layer may be at least partially arranged on side surfaces of the plurality of penetration portions.

In an embodiment, the display apparatus may further include a wiring on the plurality of connection portions, wherein an electrical signal is transmitted to the unit display portion via the wiring; and a step compensation layer arranged between the plurality of connection portions and the wiring and including an organic material.

In an embodiment, the display element may include a pixel electrode, an intermediate layer, and an opposite electrode, wherein the pixel electrode may be arranged on the planarization layer, and a pixel defining layer that covers an edge of the pixel electrode may be arranged on the planarization layer.

In an embodiment, the pixel defining layer may expose the recess.

In an embodiment, the planarization layer may include an organic planarization layer and an inorganic planarization layer arranged on the organic planarization layer, and the recess may be provided in the inorganic planarization layer.

In an embodiment, the display apparatus may further include an organic protection layer arranged between the thin film transistor and the planarization layer and covering a source electrode or a drain electrode of the thin film transistor.

In an embodiment, the thin film transistor may include at least one inorganic layer, and a step compensation layer may be arranged on a side surface of the at least one inorganic layer, the step compensation layer including an organic material.

In an embodiment, the display apparatus may further include a lower planarization layer arranged between the thin film transistor and the planarization layer; and a connection metal arranged on the lower planarization layer.

According to one or more embodiments, a display apparatus includes: a substrate including a plurality of islands apart from one another, a plurality of connection portions connecting the plurality of islands, and a plurality of penetration portions penetrating the substrate between the plurality of connection portions; a plurality of unit display portions respectively arranged on the plurality of islands; an encapsulation layer sealing each of the plurality of unit display portions, wherein each of the plurality of unit display portions includes a thin film transistor, an organic light-emitting diode electrically connected to the thin film transistor, and a planarization layer located between the thin film transistor and the organic light-emitting diode, and the planarization layer includes a recess that is concave in a depth direction at a side of the organic light-emitting diode.

In an embodiment, the organic light-emitting diode included in each of the plurality of unit display portions is provided in a plurality, and the recess may be arranged between the plurality of organic light-emitting diodes.

In an embodiment, the encapsulation layer may include an organic encapsulation layer, a first inorganic encapsulation layer arranged under the organic encapsulation layer, and a second inorganic encapsulation layer arranged over the organic encapsulation layer, wherein the organic encapsulation layer may include unit organic encapsulation layers respectively corresponding to the plurality of unit display portions, and the first inorganic encapsulation layer and the second inorganic encapsulation layer may be in contact with each other at a perimeter of the unit organic encapsulation layers.

In an embodiment, the first inorganic encapsulation layer and the second inorganic encapsulation layer may be in contact with each other on the plurality of connection portions.

In an embodiment, the first inorganic encapsulation layer and the second inorganic encapsulation layer may be at least partially arranged on side surfaces of the plurality of penetration portions.

In an embodiment, the organic light-emitting diode may include a pixel electrode, an intermediate layer including an organic emission layer, and an opposite electrode, wherein the pixel electrode may be arranged on the planarization layer, and a pixel defining layer that covers an edge of the pixel electrode may be arranged on an upper surface of the planarization layer and not overlap the recess.

In an embodiment, the display apparatus may further include, a wiring on the plurality of connection portions, wherein an electrical signal is transmitted to the plurality of unit display portions via the wiring; and a step compensation layer arranged between the plurality of connection portions and the wiring and including an organic material.

Aspects, features, and effects other than those described herein will be understood from the following detailed description, the claims, and the accompanying drawings.

BRIEF DESCRIPTION OF THE DRAWINGS

These and/or other aspects will become apparent and more readily appreciated from the following description of some embodiments, taken in conjunction with the accompanying drawings in which.

DETAILED DESCRIPTION

Figure 1:
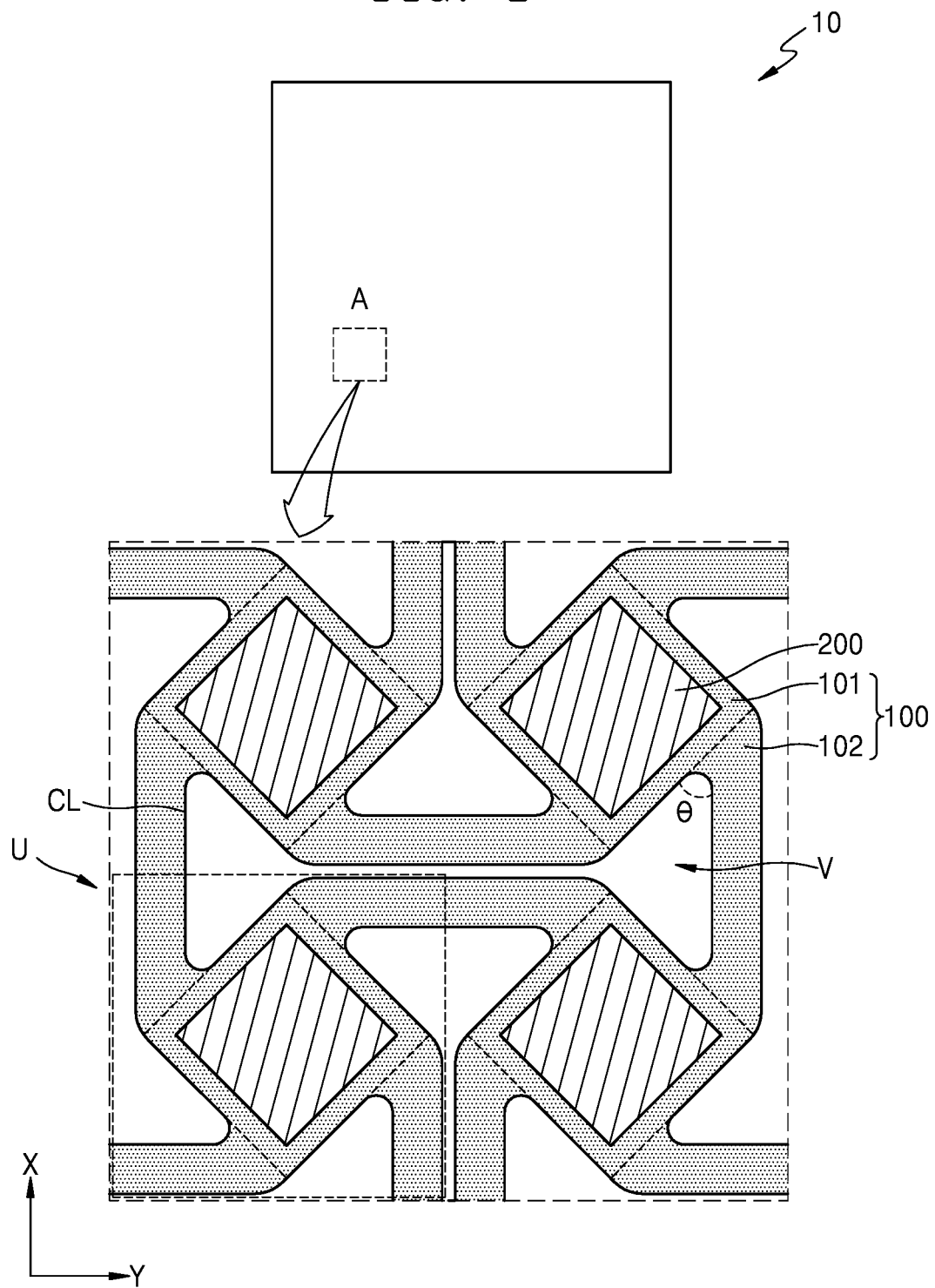
FIG. 1 is a schematic top-plan view of a display apparatus according to an embodiment.

Reference will now be made in further detail to some embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It is to be understood that although terms such as "first" and "second" may be used herein to describe various components, these components are not limited by these terms, and the terms are used to distinguish one component from another.

As used herein, the singular forms "a," "an," and "the" are intended to include the plural forms as well, unless the context clearly indicates otherwise.

It is to be further understood that the terms "comprises" and/or "comprising" used herein specify the presence of stated features or components, but do not preclude the presence or addition of one or more other features or components.

It is to be understood that when a layer, area, or component is referred to as being "formed on" another layer, area, or component, it may be directly or indirectly formed on the other layer, area, or component. That is, for example, one or more intervening layers, areas, or components may be present.

Sizes of components in the drawings may be exaggerated for convenience of explanation. In other words, since sizes and thicknesses of components in the drawings may be arbitrarily illustrated for convenience of explanation, the following embodiments are not limited thereto.

When an embodiment may be implemented differently, a specific process order may be performed differently from the described order. For example, two consecutively described processes may be performed substantially at the same time or performed in an order opposite to the described order.

In embodiments set forth herein, when a layer, area, or component is connected to another layer, area, or component, the layers, areas, or components may be directly connected to each other, and the layers, areas, or components may also be indirectly connected to each other with another layer, area, or component therebetween. For example, in the present specification, when a layer, area, or component is electrically connected to another layer, area, or component, the layers, areas, or components may be directly and electrically connected to each other, and the layers, areas, and components may also be indirectly and electrically connected to each other with another layer, area, or component therebetween.

Unless otherwise defined, all terms (including technical and scientific terms) used herein have the same meaning as commonly understood by one of ordinary skill in the art to which example embodiments of the inventive concept belong. It is to be further understood that terms, such as those defined in commonly-used dictionaries, should be interpreted as having a meaning that is consistent with their meaning in the context of the relevant art and will not be interpreted in an idealized or overly formal sense unless expressly so defined herein.

Herein, embodiments will be described in further detail with reference to the accompanying drawings. Throughout the descriptions, same numeral references will be given to same or corresponding components, and redundant descriptions thereof may be omitted.

Figure 2:
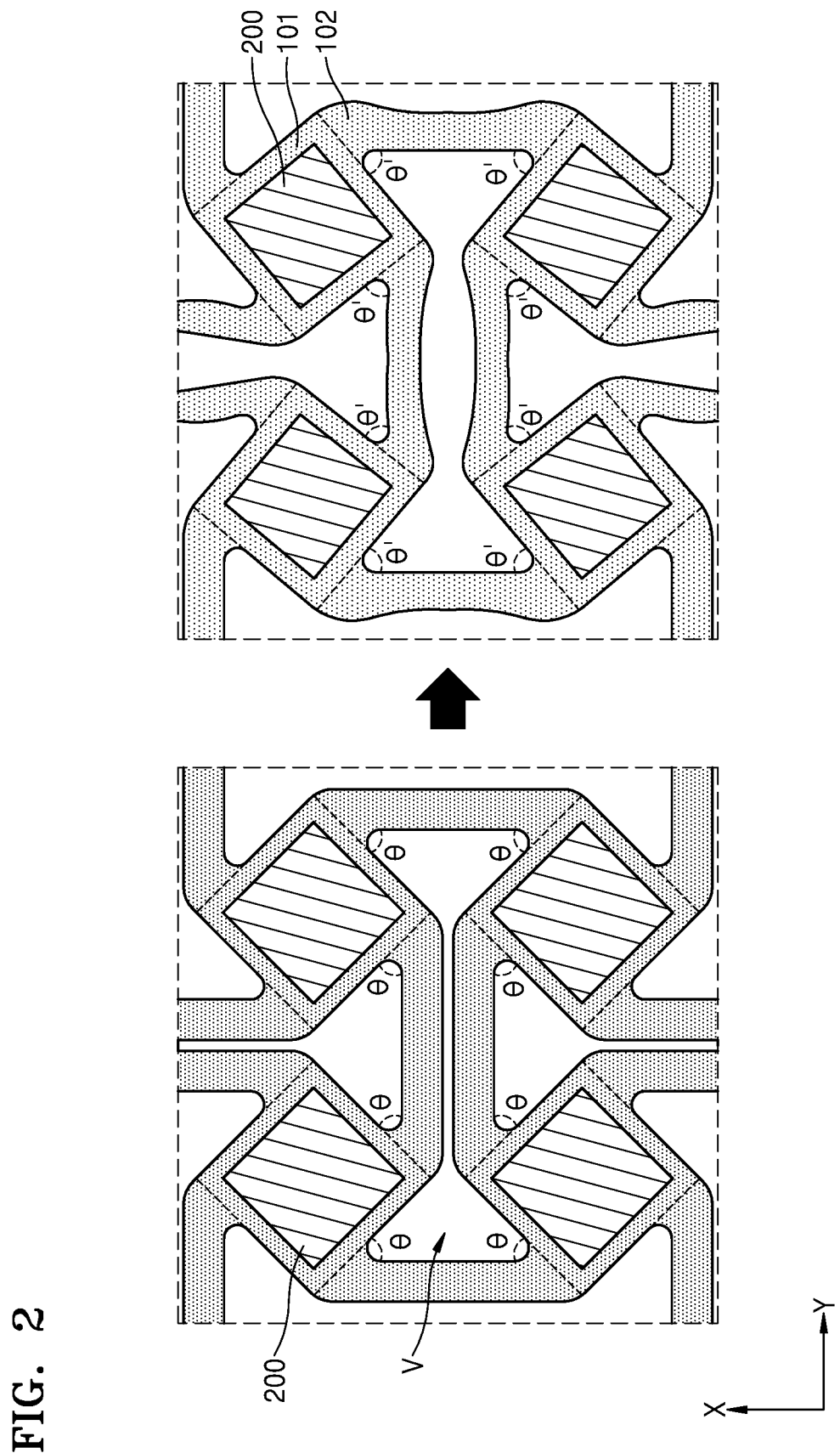
FIG. 2 is an enlarged schematic top-plan view showing an example of a region "A" shown in FIG. 1.

FIG. 1 is a schematic top-plan view of a display apparatus according to an embodiment; and FIG. 2 is an enlarged schematic top-plan view showing an example of a region "A" shown in FIG. 1.

Referring to FIG. 1, a display apparatus 10 according to an embodiment may include a substrate 100 and unit display portions 200 on the substrate 100.

The substrate 100 may include any of various materials. The substrate 100 may include any of glass, metal, an organic material, or other materials.

In an embodiment, the substrate 100 may include a flexible material. For example, the substrate 100 may include a bendable, foldable, or rollable material. For example, a flexible material included in the substrate 100 may be thin glass, metal, or plastic. When the substrate 100 includes plastic, the substrate 100 may include polyimide (PI). As another embodiment, the substrate 100 may include another type of plastic material.

The substrate 100 may include a plurality of islands 101 apart from one another, a plurality of connection portions 102 connecting the plurality of islands 101, and a plurality of penetration portions V penetrating the substrate 100 between the plurality of connection portions 102.

The plurality of islands 101 may be arranged apart from one another. For example, the plurality of islands 101 may be repeatedly arranged in a first direction X and a second direction Y that is different from the first direction X and form a planar grid pattern. For example, the first direction X and the second direction Y may be orthogonal to each other. As another example, the first direction X and the second direction Y may form an obtuse angle or an acute angle.

The plurality of unit display portions 200 may be respectively arranged on the plurality of islands 101. The unit display portion 200 may include at least one display element to realize visible rays.

The connection portions 102 may connect the plurality of islands 101. In an embodiment, four connection portions 102 may be connected to each of the plurality of islands 101, and the four connection portions 102 connected to one island 101 may respectively extend in different directions and be arranged adjacent to the one island 101 to be respectively connected to four other islands 101 surrounding the one island 101. The plurality of islands 101 and the plurality of connection portions 102 may include at least a portion that continuously includes a same material. The plurality of islands 101 and the plurality of connection portions 102 may be integrally formed.

The penetration portions V are formed to penetrate the substrate 100. The penetration portion V may provide a separation area between the plurality of islands 101, reduce a weight of the substrate 100, and enhance the flexibility of the substrate 100. In addition, according to modification of shapes of the penetration portions V when the substrate 100 is bent or rolled, generation of stress occurring during the modification of the shape of substrate 100 may be reduced, and, thus, abnormal modification of the shape of the substrate 100 may be prevented or substantially prevented and durability of the substrate 100 may be enhanced. Accordingly, user convenience during use of the display apparatus 10 may be improved, and the display apparatus 10 may be applied to a wearable device, for example.

The penetration portion V may be formed by removing a portion of the substrate 100 by a method such as etching, and, as another example, the penetration portion V may also be formed while manufacturing the substrate 100. A process of forming the penetration portion V in the substrate 100 may be performed by any of various examples, and a method thereof is not limited.

Herein, a unit portion U as a basic unit for constructing the substrate 100 is defined, and a structure of the substrate 100 will be described in further detail based on the unit portion U.

The unit portion U may be repeatedly arranged in the first direction X and the second direction Y. In other words, it may be understood that a plurality of unit portions U that are repeatedly arranged in the first direction X and the second direction Y are combined with one another and form the substrate 100. The unit portion U may include the island 101 and at least one connection portion 102 connected to the island 101. Four connection portions 102 may be connected to one island 101.

The islands 101 of two adjacent unit portions U may be away from each other, and the connection portions 102 of the two adjacent unit portions U may be connected to each other. Here, the connection portion 102 included in the unit portion U may refer to a partial area of the connection portion 102 located in an area of the unit portion U or to the entire connection portion 102 that connects two adjacent islands 101 between the two adjacent islands 101.

Among the plurality of unit portions U, four adjacent unit portions U form a closed curve CL therebetween, and the closed curve CL may define the penetration portion V which is an empty space. The penetration portion V, which is formed by removing an area from the substrate 100, may enhance the flexibility of the substrate 100 and decrease stress that is generated when the substrate 100 is transformed. A width of the connection portion 102 may be less than that of the island 101, and, thus, the penetration portion V may also be in contact with the islands 101 in four unit portions U.

In an embodiment, from among the plurality of unit portions U, two adjacent unit portions U may be symmetrical to each other. As shown in FIG. 1, one unit portion U may be symmetrical with another unit portion U that is arranged adjacent to the one unit portion U in the second direction Y with reference to a symmetry axis parallel to the first direction X, and the one unit portion U may be symmetrical with another unit portion U that is arranged adjacent to the one unit portion U in the first direction X with reference to a symmetry axis parallel to the second direction Y.

In addition, an angle (θ) formed between a direction in which the connection portion 102 extends and a side surface of the island 101 to which the connection portion 102 is connected may be an acute angle. For example, when the island 101 has a quadrilateral shape and quadrilateral corner portions thereof are arranged to face the first direction X and the second direction Y, the connection portions 102 may be connected to the island 101 in an area adjacent to the corner portions and extend in a direction parallel to the second direction Y or the first direction X. In other words, a connection portion 102 that is connected to a corner portion facing the first direction may face the second direction Y or a direction opposite the second direction (−Y), and a connection portion 102 that is connected to a corner portion facing the second direction Y may face the first direction X or a direction opposite the first direction (−X). Accordingly, side surfaces of two adjacent islands 101 connected to one connection portion 102 and a direction in which the one connection portion 102 extends may respectively form an acute angle. Therefore, the islands 101 may be densely arranged and lengths of the connection portions 102 may be minimized or reduced, thereby maximizing or increasing an area of the penetration portion V. In addition, an elongation property may be provided to the substrate 100, as shown in FIG. 2.

FIG. 2 shows a shape when the substrate 100 extends in the first direction X and the second direction Y. Referring to FIG. 2, when an external force is applied to the substrate, each angle formed by the side surface of the island 101 connected to the connection portion 102 and the connection portion 102 increases ($\theta < \theta'$), and, thus, the area of the penetration portion V may increase. Therefore, as intervals between the islands 101 are increased, the substrate 100 may be elongated in the first direction X and the second direction Y and transformed two-dimensionally or three-dimensionally.

As the connection portion 102 has a width less than that of the island 101, modification of shapes for increasing the angle mainly occurs in the connection portion 102 when an external force is applied to the substrate 100, and a shape of the island 101 may not be modified when the substrate 100 is elongated. Therefore, the unit display portion 200 arranged on the island 101 may be stably maintained even when the substrate 100 extends, and, thus, the display apparatus 10 may be applied to a display apparatus requiring flexibility, such as any of a bending display apparatus, a flexible display apparatus, or a stretchable display apparatus, and the like, for example.

During the elongation of the substrate 100, stress is concentrated on a connection part of the connection portion 102 that is connected to the side surface of the island 101. Therefore, the connection part of the connection portion 102 may include a curved surface to prevent or substantially prevent the connection portion 102 from being torn or the like due to the concentration of the stress.

Figure 3:
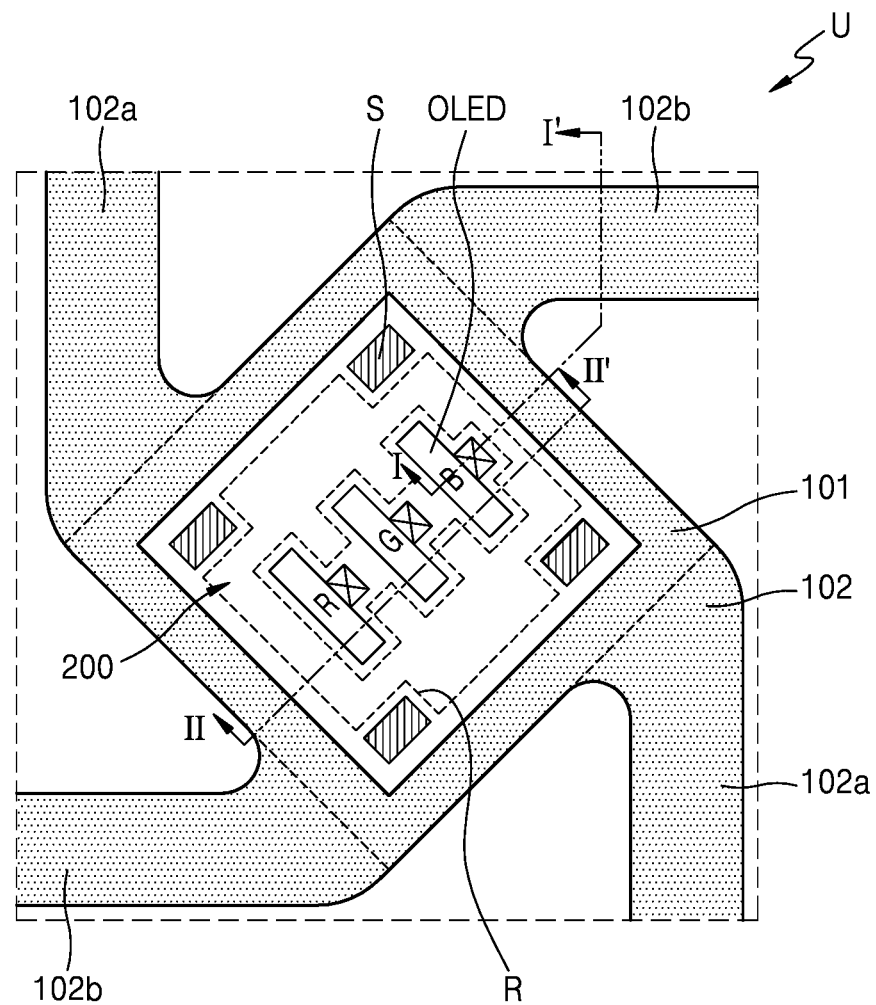
FIG. 3 is a schematic top-plan view of a unit display portion shown in FIG. 1.
Figure 4:
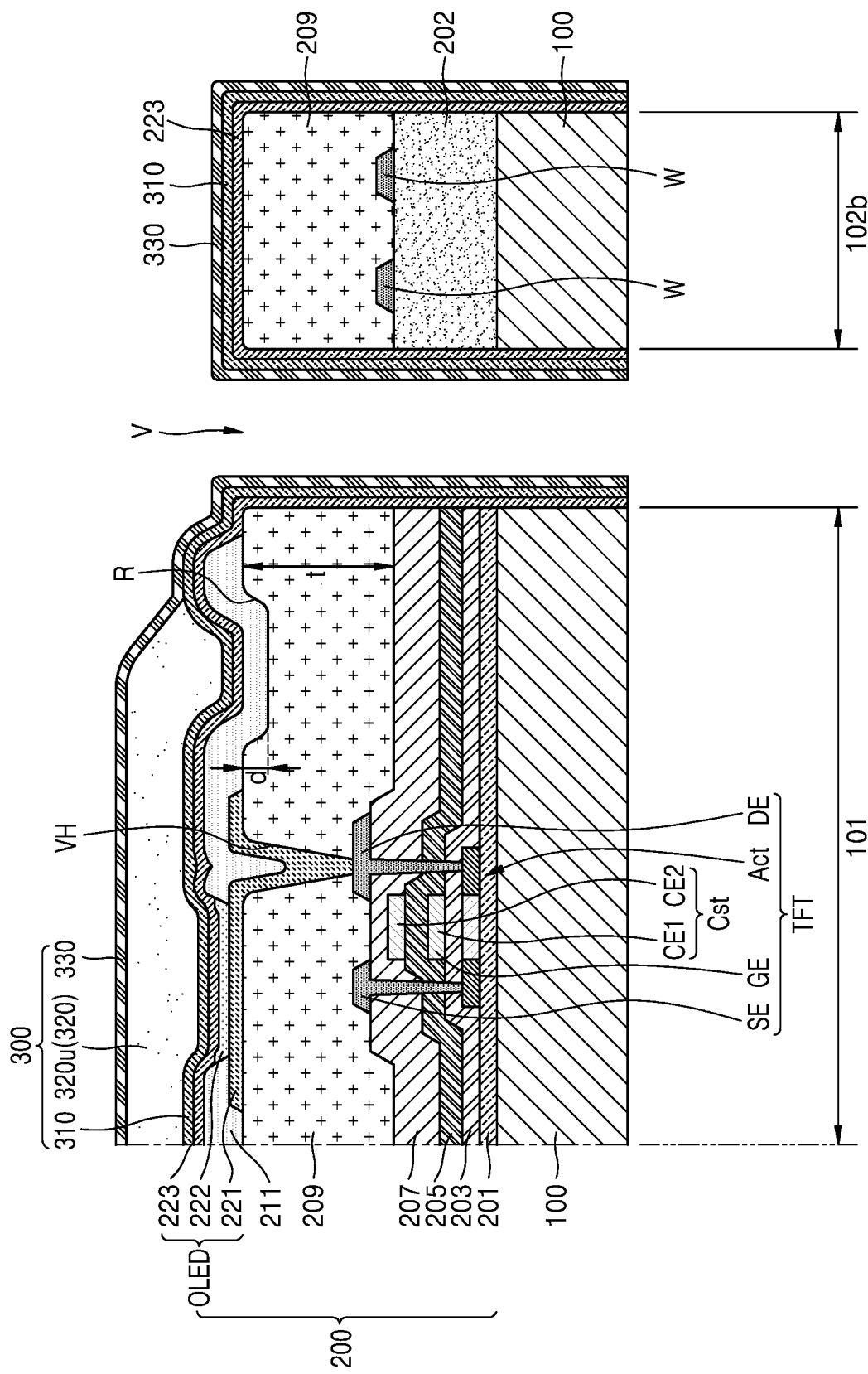
FIG. 4 is a schematic cross-sectional view showing an example of a cross-section taken along the line I-I' shown in FIG. 3.

FIG. 3 is a schematic top-plan view of a unit display portion shown in FIG. 1; FIG. 4 is a schematic cross-sectional view showing an example of a cross-section taken along the line I-I' shown in FIG. 3; and FIG. 5 is a schematic cross-sectional view showing an example of a cross-section taken along the line II-II' shown in FIG. 3.

Figure 5:
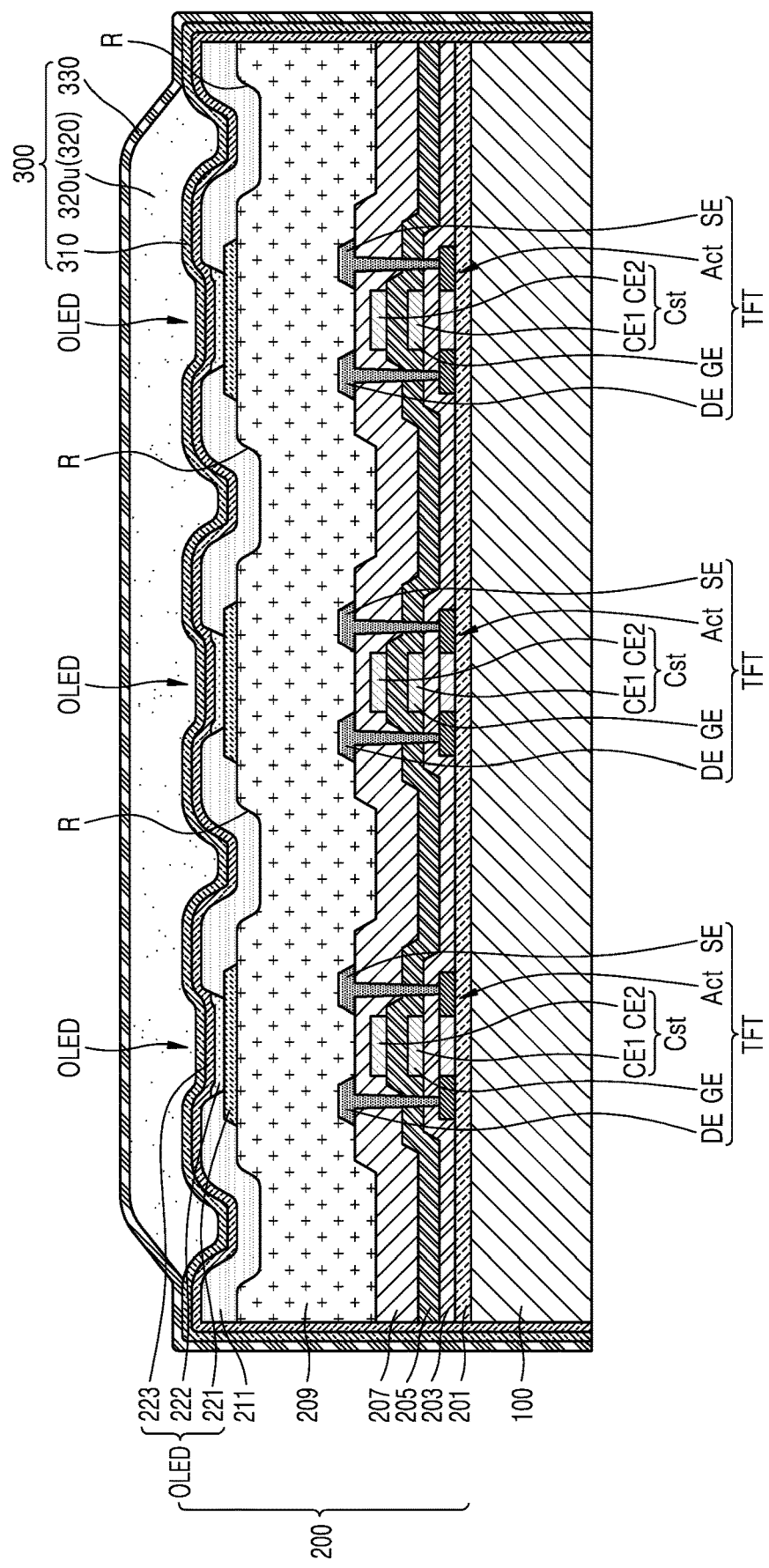
FIG. 5 is a schematic cross-sectional view showing an example of a cross-section taken along the line II-II' shown in FIG. 3.

Referring to FIGS. 3 through 5, the unit display portion 200 and the encapsulation layer 300 for sealing the unit display portion 200 may be located in the island 101 of the unit portion U, and the connection portion 102 may include a pair of first connection portions 102a located at two opposite sides with reference to the island 101 and respectively extending in a direction parallel to the first direction X and a pair of second connection portions 102b located at two opposite sides with reference to the island 101 and respectively extending in a direction parallel to the second direction Y.

The unit display portion 200 is located on the island 101, and, in an embodiment, at least one organic light-emitting diode OLED that emits red, blue, green, or white light may be located in the unit display portion 200, and the organic light-emitting diode OLED may be electrically connected to a thin film transistor TFT. In the present embodiment, the organic light-emitting diode OLED is described as a display element. However, embodiments are not limited thereto, and the unit display portion 200 may include any of various kinds of display elements, such as an inorganic electroluminescent (EL) device, a quantum dot light-emitting device, and a liquid crystal device.

The unit display portions 200 may respectively include a plurality of organic light-emitting diodes OLED respectively emitting different light. For example, as shown in FIGS. 3 through 5, one unit display portion 200 may form one pixel by including an organic light-emitting diode OLED that emits red (R) light, an organic light-emitting diode OLED that emits green (G) light, and an organic light-emitting diode OLED that emits blue (B) light.

However, embodiments are not limited thereto. As another example, each of the unit display portions 200 may include one organic light-emitting diode OLED that emits red, blue, green, or white light, thereby forming a sub-pixel. As another example, the unit display portions 200 may each include a plurality of pixels.

In addition, the organic light-emitting diodes OLEDs in the unit display portion 200 may be variously arranged, for example, in any of an RGB manner, a Pentile structure, and a honeycomb structure, according to the efficiency of a material included in an organic emission layer.

A spacer S may be formed around the unit display portion 200. The spacer S is a member for preventing or substantially preventing a mask from being stamped, and a height of the spacer S at an upper surface of the substrate 100 may be greater than a height of the organic light-emitting diode OLED. In FIG. 3, the spacer S is provided at outer corner portions in the perimeter of the unit display portion 200, but embodiments are not limited thereto. For example, the spacer S may be arranged in the unit display portion 200. For example, the spacer S may be provided on a pixel defining layer 211 that is formed in the unit display portion 200.

Referring to FIG. 4, the display apparatus according to an embodiment includes a substrate 100, the unit display portions 200 each including a planarization layer 209, and an encapsulation layer 300 that seals each of the unit display portions 200. The unit display portion 200 may be arranged on the island 101 of the substrate 100, and wirings may be arranged on the connection portion 102 connecting the islands 101.

First, the unit display portion 200 and the encapsulation layer 300 arranged in the island 101 are described according to their stacking order.

A buffer layer 201 to prevent or substantially prevent permeation of foreign materials into a semiconductor layer Act of a thin film transistor TFT may be formed on the island 101. The buffer layer 201 may include an inorganic insulating layer, such as silicon oxide ($SiO_x$) or silicon nitride ($SiN_x$), and may include a single layer or a multi-layer including the inorganic insulating layer.

A pixel circuit may be arranged on the buffer layer 201. The pixel circuit includes a thin film transistor TFT and a storage capacitor Cst. The thin film transistor TFT may include the semiconductor layer Act, a gate electrode GE, a source electrode SE, and a drain electrode DE. In the present embodiment, a top-gate type thin film transistor in which the gate electrode GE is located on the semiconductor layer Act with a gate insulating layer 203 therebetween is illustrated. However, according to another embodiment, the thin film transistor TFT may be a bottom-gate type.

In an embodiment, the semiconductor layer Act may include polysilicon. In another embodiment, the semiconductor layer Act may include amorphous silicon, an oxide semiconductor, an organic semiconductor, or the like. The gate electrode GE may include a low resistance metal material. In an embodiment, the gate electrode GE may include a conductive material including any of molybdenum (Mo), aluminum (Al), copper (Cu), titanium (Ti), and the like, and may include a multi-layer or a single layer including the above-described materials.

The gate insulating layer 203 between the semiconductor layer Act and the gate electrode GE may include an inorganic insulating material, such as any of silicon oxide, silicon nitride, silicon oxynitride, aluminum oxide, titanium oxide, tantalum oxide, and hafnium oxide. The gate insulating layer 203 may include a single layer or a multi-layer including the above-described materials.

The source electrode SE and the drain electrode DE may include a highly conductive material. In an embodiment, the source electrode SE and the drain electrode DE may each include a material including any of Mo, Al, Cu, Ti, and the like, and may include a multi-layer or a single layer including the above-described materials. For example, the source electrode SE and the drain electrode DE may include a multi-layer of Ti/Al/Ti.

The storage capacitor Cst includes a lower electrode CE1 and an upper electrode CE2 overlapping the lower electrode CE1 with a first interlayer insulating layer 205 therebetween. The storage capacitor Cst may overlap the thin film transistor TFT. In this regard, FIG. 4 shows a case in which the gate electrode GE of the thin film transistor TFT is the lower electrode CE1 of the storage capacitor Cst. In another embodiment, the storage capacitor Cst may not overlap the thin film transistor TFT. The storage capacitor Cst may be covered by a second interlayer insulating layer 207.

The first interlayer insulating layer 205 and the second interlayer insulating layer 207 may include an inorganic insulating material, such as any of silicon oxide, silicon nitride, silicon oxynitride, aluminum oxide, titanium oxide, tantalum oxide, and hafnium oxide. The first interlayer insulating layer 205 and the second interlayer insulating layer 207 may each include a single layer or a multi-layer including the above-described materials.

The pixel circuit including the thin film transistor TFT and the storage capacitor Cst may be covered by the planarization layer 209.

The planarization layer 209 may include an organic insulating material, such as a general commercial polymer such as any of polymethyl methacrylate (PMMA) or polystyrene (PS), a polymer derivative having a phenolic group, an acrylic polymer, an imide-based polymer, an aryl ether-based polymer, an amide-based polymer, a fluoride-based polymer, a p-xylene based polymer, a vinyl alcohol-based polymer, and a blend thereof. In an embodiment, the planarization layer 209 may include polyimide.

In another embodiment, the planarization layer 209 may include an inorganic insulating material such as silicon oxide, silicon nitride, silicon oxynitride, aluminum oxide, titanium oxide, tantalum oxide, and hafnium oxide. As another embodiment, the planarization layer 209 may include a structure in which an organic insulating layer and an inorganic insulating layer are stacked. The planarization layer 209 may include an inorganic insulating material and an organic insulating material.

In the present embodiment, the planarization layer 209 may include a plane in which an upper surface is approximately even, and include, in a partial area, a recess R that is concave in a depth direction. The recess R may be provided in an area in which a pixel electrode 221 is not arranged. That is, the pixel electrode 221 may be arranged on the even upper surface of the planarization layer 209, and the recess R may be formed in the area in which the pixel electrode 221 is not formed. The recess R may be introduced to prevent or substantially prevent a material for forming a unit organic encapsulation layer 320u of the encapsulation layer 300, which will be described later, from running down the penetration portion V.

To form the planarization layer 209, after coating a liquid organic material to cover the thin film transistor TFT, a mask process and a development process may be performed such that a via hole VH for exposing the drain electrode DE of the thin film transistor TFT is formed. As described above, the planarization layer 209 is formed by curing a liquid organic material, and an upper surface of the planarization layer 209 may be formed approximately even.

Next, after forming a photoresist such that an area in which the recess R is to be formed is exposed, the recess R may be formed by an etching process. In an embodiment, the etching process may be a dry etching process.

However, embodiments are not limited thereto. The recess R may be concurrently (e.g., simultaneously) formed with the via hole VH of the planarization layer 209. For example, when the planarization layer 209 is formed, the via hole VH and the recess R may be concurrently (e.g., simultaneously) formed in a process using a halftone mask.

In an embodiment, a depth d of the recess R may be approximately 1 μm or more. In an embodiment, the depth d of the recess R may be about 20%, 30%, or 50% of a thickness t of the planarization layer 209. In some embodiments, a thickness t of the planarization layer 209 may be about 4 μm, and the depth d of the recess R may be from about 1 μm to about 2 μm. In this case, the depth d of the recess R may indicate a distance from the even upper surface of the planarization layer 209 to a lower surface of the recess R, and the thickness t of the planarization layer 209 may indicate a longest distance between an upper surface of a layer (e.g., the second interlayer insulating layer 207) on which the source electrode SE or the drain electrode DE of the thin film transistor TFT is arranged, to the upper surface of the planarization layer 209.

As the recess R surrounds the organic light-emitting diode OLED, when a plurality of organic light-emitting diodes OLED are provided in the unit display portion 200, the recess R may also be provided between the organic light-emitting diodes OLED, as shown in FIG. 5.

The pixel electrode 221 may be formed on the flat upper surface of the planarization layer 209. The pixel electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a combination thereof. In another embodiment, a pixel electrode 221 may further include a film including ITO, IZO, ZnO, or $In_2O_3$ above/under the above-described reflective film.

A pixel defining layer 211 may be formed on the pixel electrode 221. The pixel defining layer 211 may include an opening that exposes an upper surface of the pixel electrode 221 and cover edges of the pixel electrode 221. Accordingly, the pixel defining layer 211 may define an emission area of a pixel. The pixel defining layer 211 may include an organic insulating material. In an embodiment, the pixel defining layer 211 may include an inorganic insulating material, such as $SiN_x$, SiON, or $SiO_x$. In another embodiment, the pixel defining layer 211 may include an organic insulating material and an inorganic insulating material.

In an embodiment, a thickness of the pixel defining layer 211 may be less than the thickness of the planarization layer 209. Accordingly, the pixel defining layer 211 may fill the recess R of the planarization layer 209, and a concave portion corresponding to the shape of the recess R may be formed on an upper surface of the pixel defining layer 211.

An intermediate layer 222 of the organic light-emitting diode OLED may include a low molecular weight material or a polymer material. When the intermediate layer 222 includes a low molecular weight material, a hole injection layer (HIL), an emission layer (EML), an electron transport layer (ETL), an electron injection layer (EIL), and the like may have a single-layer structure or a multi-layer stack structure, and the low molecular weight material may include any of various organic materials such as copper phthalocyanine (CuPc), N, N'-Di(Naphthalene-1-yl)-N,N'-diphenyl-benzidine (NPB), and tris-8-hydroxyquinoline aluminum (Alq3). In an embodiment, such layers may be formed by a vacuum deposition method.

In an embodiment, the intermediate layer 222, which includes a polymer material, may have a structure including an HTL and an EML. In this case, the HTL may include poly(3,4-ethylenedioxythiophene (PEDOT)), and the EML may include a high molecular weight material, such as a poly-phenylenevinylene material and polyfluorene. The intermediate layer 222 may be formed by using any of a screen printing method, an inkjet printing method, a laser induced thermal imaging (LITI) method, and the like.

However, the intermediate layer 222 is not limited thereto and may have any of various structures. In addition, the intermediate layer 222 may include a layer integrally formed over a plurality of pixel electrodes 221 and may also include a layer that is patterned to correspond to each of the plurality of pixel electrodes 221.

An opposite electrode 223 may include a conductive material that has a small work function. For example, the opposite electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. In an embodiment, the opposite electrode 223 may further include a layer such as ITO, IZO, ZnO, or $In_2O_3$ on the (semi)transparent layer including the above-described materials. The opposite electrode 223 may be formed not only in the display area DA but also in a first non-display area. In an embodiment, the intermediate layer 222 and the opposite electrode 223 may be formed by a thermal deposition method. The opposite electrode 223, which is formed on the top surface of the substrate 100, may also be partially arranged on a side surface of the penetration portion V.

A capping layer (not shown) for protecting the opposite electrode 223 may be further arranged on the opposite electrode 223. The capping layer may include lithium fluoride (LiF), an inorganic material, and/or an organic material.

The encapsulation layer 300 that seals the unit display portion 200 is formed on the opposite electrode 223. The encapsulation layer 300 may block external oxygen or moisture and include a single layer or a multi-layer. The encapsulation layer 300 may include at least one of an organic encapsulation layer and an inorganic encapsulation layer.

In FIGS. 4 and 5, in an embodiment, the encapsulation layer 300 includes first and second inorganic encapsulation layer 310 and 330 and an organic encapsulation layer 320 located between the first inorganic encapsulation layer 310 and the second inorganic encapsulation layer 320, but embodiments are not limited thereto. In another embodiment, the number of organic encapsulation layer, the number of inorganic encapsulation layer, and the stacking order may be variously modified.

The first inorganic encapsulation layer 310 and the second inorganic encapsulation layer 330 may include at least one inorganic insulating material, such as aluminum oxide, titanium oxide, tantalum oxide, hafnium oxide, zinc oxide, silicon oxide, silicon nitride, or silicon oxynitride, and be formed by a chemical vapor deposition (CVD) method or the like. The organic encapsulation layer 320 may include a polymer-based material. The polymer-based material may include any of an acrylic resin, an epoxy resin, polyimide, polyethylene, and the like.

As the first inorganic encapsulation layer 310 is formed along a structure located thereunder, as shown in FIGS. 4 and 5, in an embodiment, an upper surface of the first inorganic encapsulation layer 310 is not even. The organic encapsulation layer 320 covers the first inorganic encapsulation layer 310, and, unlike the first inorganic encapsulation layer 310, the organic encapsulation layer 320 may have an upper surface that is approximately even. More particularly, the upper surface of the organic encapsulation layer 320 may be approximately even in a portion corresponding to the organic light-emitting diode OLED which is a display element. In addition, the organic encapsulation layer 320 may alleviate stress occurring to the first and second inorganic encapsulation layers 310 and 330.

The organic encapsulation layer 320 may include any of polymethyl methacrylate (PMMA), polycarbonate (PC), polystyrene (PS), an acrylic resin, an epoxy resin, polyimide, polyethylene, polyethylene sulfonate, polyoxymethylene, polyarylate, hexamethyldisiloxane, and the like.

In the present embodiment, the organic encapsulation layer 320 may be provided as unit organic encapsulation layers 320u to respectively correspond to the unit display portions 200. That is, the unit organic encapsulation layer 320u may be arranged on the island 101 of the substrate 100 and not be arranged on the connection portion 102. Accordingly, the first inorganic encapsulation layer 310 and the second inorganic encapsulation layer 330 may be in contact with each other at a perimeter of the unit organic encapsulation layer 320u to individually encapsulate each of the unit display portions 200.

As described above, the encapsulation layer 300 includes the first inorganic encapsulation layer 310, the organic encapsulation layer 320, and the second inorganic encapsulation layer 330, and by using this multi-layer structure, even when cracks occur in the encapsulation layer 300, connection between the cracks between the first inorganic encapsulation layer 310 and the organic encapsulation layer 320 or between the organic encapsulation layer 320 and the second inorganic encapsulation layer 330 may be prevented or substantially prevented. Accordingly, formation of a path through which external moisture or oxygen may permeate into the unit display portion 200 may be prevented or minimized. In addition, the second inorganic encapsulation layer 330 may be in contact with the first inorganic encapsulation layer 310 at an edge located outside the unit organic encapsulation layer 320u, thereby preventing or substantially preventing the unit organic encapsulation layer 320u from being exposed to outside.

In an embodiment, the first inorganic encapsulation layer 310 and the second inorganic encapsulation layer 330 may be formed by using a CVD method with respect to an entire surface of the substrate 100, and the first inorganic encapsulation layer 310 and the second inorganic encapsulation layer 330 may be formed to cover a side surface of the penetration portion V.

When forming the unit organic encapsulation layer 320u, a certain amount of liquid organic material is applied to correspond to the unit display portion 200, and a curing process is performed on the coated liquid organic material. At this time, due to the properties of the liquid organic material, a flow is generated toward an edge of the unit display portion 200.

In the present embodiment, as the recess R that is concave in the depth direction is formed in the upper surface of the planarization layer 209, the liquid organic material for forming the unit organic encapsulation layer 320u may be prevented or substantially prevented from running down the edge of the unit display portion 200.

To prevent or substantially prevent the liquid organic material from running down the edge of the unit display portion 200 and flow over the penetration portion V, a protruding dam structure may be provided at the edge of the unit display portion 200. However, when the dam structure is provided, the dam structure may be damaged during formation of the penetration portion V.

In embodiments of the present disclosure, the recess R may be formed in the upper surface of the planarization layer 209 to surround the organic light-emitting diode OLED, which is a display element, in the unit display portion 200 to prevent or substantially prevent formation of an edge tail of the unit organic encapsulation layer 320u.

In an embodiment, the pixel defining layer 211, the opposite electrode 223, and the first inorganic encapsulation layer 310 may fill the recess R. In this case, the pixel defining layer 211, the opposite electrode 223, and the first inorganic encapsulation layer 310 may have small thicknesses, and concave portions corresponding to the shape of the recess R may also be formed in upper surfaces of the pixel defining layer 211, the opposite electrode 223, and the first inorganic encapsulation layer 310. The unit organic encapsulation layer 320u may be prevented or substantially prevented from running down the edge of the island 101 due to the concave portion.

A step compensation layer 202 may be arranged on a connection portion 102b of the substrate 100. The connection portion 102b of the substrate 100 may have a smaller width than that of the island 101, and thus may be vulnerable to stress that occurs when the shape of the display apparatus is modified. Accordingly, at least one of the buffer layer 201, the gate insulating layer 203, the first interlayer insulating layer 205, and the second interlayer insulating layer 207, which are inorganic insulating layers, may not be arranged on the connection portion 102b of the substrate 100.

For example, the buffer layer 201, the gate insulating layer 203, the first interlayer insulating layer 205, and the second interlayer insulating layer 207 may be removed from the connection portion 102b by a process such as an etching process, and a step compensation layer 202 including an organic material may be formed.

A wiring W for transmitting a voltage or a signal to the unit display portion 200 is arranged on the step compensation layer 202. Therefore, the step compensation layer 202 may prevent or substantially prevent a height difference when the wiring W is connected to the island 101 and absorb stress that may be applied to the wiring W.

The step compensation layer 202 may include an organic insulating material, such as any of polyimide, polyamide, acryl resin, benzocyclobutene, hexamethyldisiloxane (HMDSO), and phenolic resin. The step compensation layer 202 may include a single layer or multi-layer structure including the above-described organic insulating material.

In an embodiment, the wiring W arranged on the step compensation layer 202 may include a same material as that of the source electrode SE or the drain electrode DE of the thin film transistor TFT arranged on the island 101. In an embodiment, the wiring W arranged on the step compensation layer 202 may include a same material as that of the gate electrode GE of the thin film transistor TFT. The wirings W may include wirings for transmitting a voltage or a signal to the pixel circuit.

The wiring W may be covered by the planarization layer 209. The opposite electrode 223, the first inorganic encapsulation layer 310, and the second inorganic encapsulation layer 330 may be stacked on the planarization layer 209. The opposite electrode 223, the first inorganic encapsulation layer 310, and the second inorganic encapsulation layer 330, which may be formed by using an open mask after the penetration hole V is formed, may surround side surfaces of the penetration hole V. In an embodiment, although not shown, the pixel defining layer 211 may be further arranged between the planarization layer 209 and the opposite electrode 223, and a capping layer may be further arranged between the opposite electrode 223 and the first inorganic encapsulation layer 310.

Figure 6:
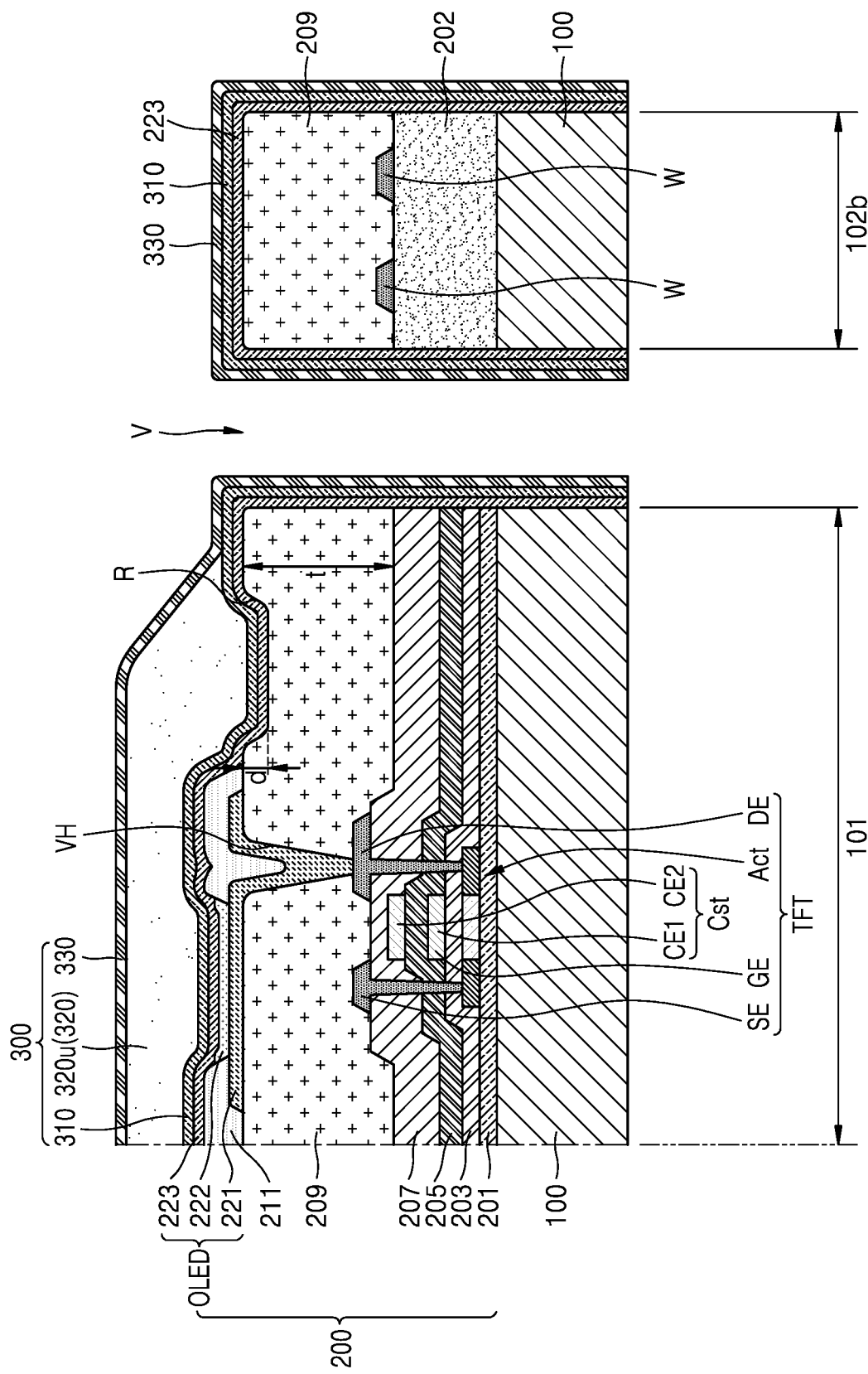
FIG. 6 is a schematic cross-sectional view showing a display apparatus according to another embodiment.

FIG. 6 is a schematic cross-sectional view showing a display apparatus according to another embodiment. FIG. 6 may correspond to the line I-I' shown in FIG. 3. In FIG. 6, like reference numerals as those of FIGS. 3 and 4 denote like components, and repeated descriptions thereof may be omitted.

Referring to FIG. 6, a display apparatus according to an embodiment includes the substrate 100, the unit display portions 200 including the planarization layer 209, and the encapsulation layer 300 that seals each of the unit display portions 200.

As shown in FIGS. 1 through 3, the substrate 100 may include the plurality of islands 101 apart from one another, the plurality of connection portions 102 that connect the plurality of islands 101, and the plurality of penetration portions V that penetrate the substrate 100 between the plurality of connection portions 102.

The unit display portions 200 are respectively arranged on the plurality of islands 101. That is, the unit display portion 200 may indicate a group of display elements arranged on one island 101. In an embodiment, the unit display portion 200 may include only one display element. In another embodiment, the unit display portion 200 may include a plurality of display elements representing red, green, and blue colors.

The unit display portion 200 includes the planarization layer 209, and the display element, for example, the organic light-emitting diode OLED, may be arranged on the planarization layer 209. The planarization layer 209 may provide an even upper surface in an area in which the organic light-emitting diode OLED, which is a display element, is arranged, and may include a recess R that is concave in the depth direction at a side of the display element or around the display element.

In an embodiment, the depth d of the recess R may be approximately 1 μm or more. In an embodiment, the depth d of the recess R may be about 20%, 30%, or 50% with reference to the thickness t of the planarization layer 209. In some embodiments, the thickness t of the planarization layer 209 may be about 4 μm, and the depth d of the recess R may be from about 1 μm to about 2 μm. In this case, the depth d of the recess R indicates a distance from the even upper surface of the planarization layer 209 to a lower surface of the recess R, and the thickness t of the planarization layer 209 may indicate a longest distance between an upper surface of a layer (e.g., the second interlayer insulating layer 207) on which the source electrode SE or the drain electrode DE of the thin film transistor TFT is arranged to the upper surface of the planarization layer 209.

In the present embodiment, the pixel defining layer 211 may not be arranged on the recess R. That is, the pixel defining layer 211 may be formed to expose the recess R. As the pixel defining layer 211 does not fill an inner portion of the recess R, a depth of a concave portion formed in the first inorganic encapsulation layer 310 may be greater than that of a case in which the pixel defining layer 211 is arranged in the recess R.

As the depth of the concave portion increases, the organic encapsulation layer 320 may be more effectively prevented from running down the edge of the island 101.

That is, in the present embodiment, as the planarization layer 209 includes the recess R, the unit organic encapsulation layer 320u included in the encapsulation layer 300 does not flow toward the penetration portion V and is arranged to correspond to the unit display portion 200, and the first inorganic encapsulation layer 310 and the second inorganic encapsulation layer 330 are in contact with each other at a perimeter of the unit organic encapsulation layer 320u. Accordingly, the encapsulation layer 300 seals each of the unit display portions 200.

Figure 7:
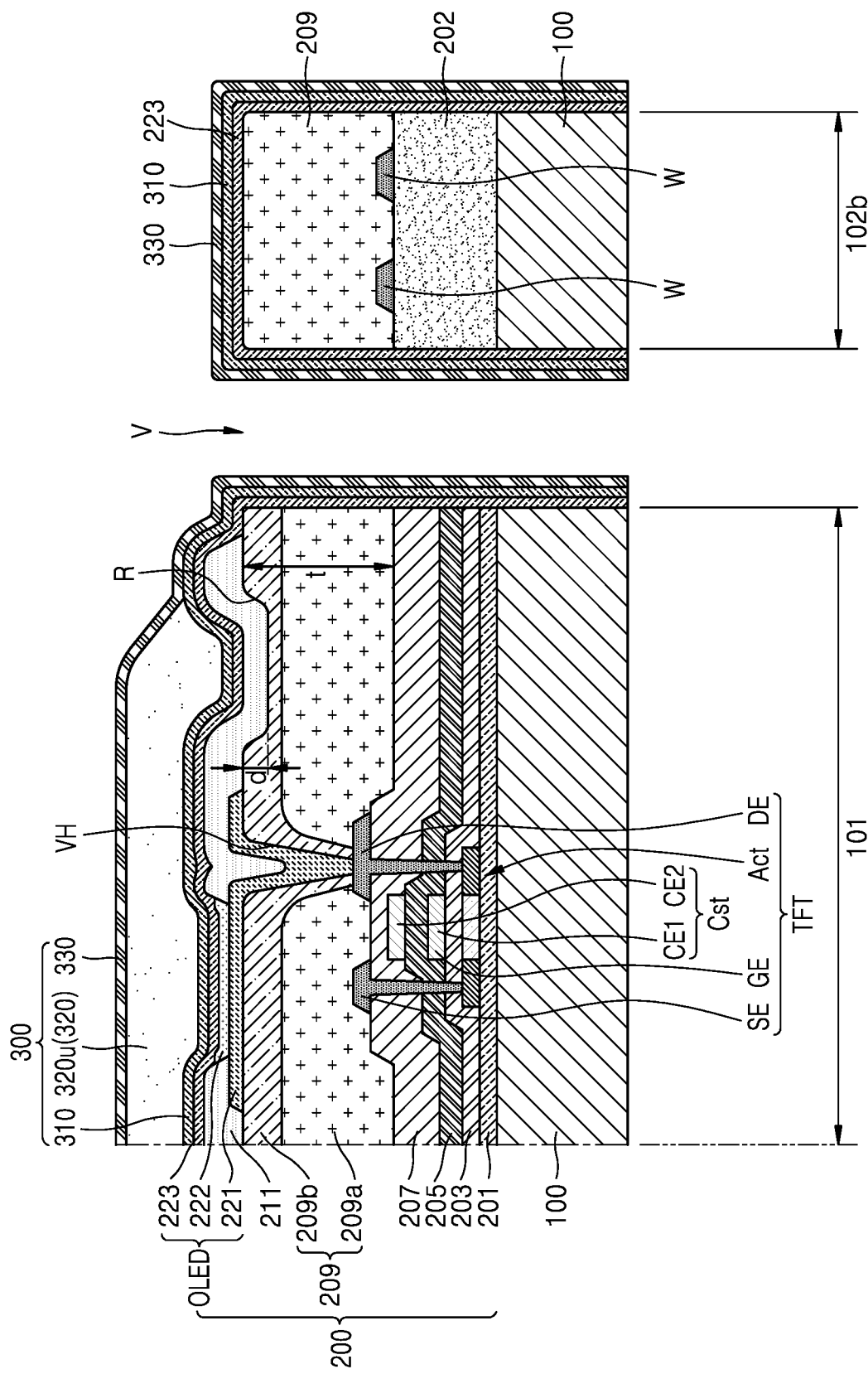
FIG. 7 is a schematic cross-sectional view showing a display apparatus according to another embodiment.

FIG. 7 is a schematic cross-sectional view showing a display apparatus according to another embodiment. FIG. 7 may correspond to the line I-I' shown in FIG. 3. In FIG. 7, like reference numerals as those of FIGS. 3 and 4 denote like components, and repeated descriptions thereof may be omitted.

Referring to FIG. 7, the display apparatus according to an embodiment includes the substrate 100, the unit display portion 200 including the planarization layer 209, and the encapsulation layer 300 sealing each of the unit display portions 200.

As shown in FIGS. 1 through 3, the substrate 100 may include the plurality of islands 101 apart from one another, the plurality of connection portions 102 connecting the plurality of islands 101, and the plurality of penetration portions V penetrating the substrate 100 between the plurality of connection portions 102.

The unit display portions 200 are respectively arranged on the plurality of islands 101. That is, the unit display portion 200 may be a group of display elements arranged on one island 101. In an embodiment, the unit display portion 200 may include only one display element. In another embodiment, the unit display portion 200 may include a plurality of display elements representing red, green, and blue colors.

The unit display portion 200 includes the planarization layer 209, and the display element, for example, the organic light-emitting diode OLED, may be arranged on the planarization layer 209. The planarization layer 209 may provide an even upper surface in an area in which the organic light-emitting diode OLED that is a display element is arranged, and may include a recess R that is concave in the depth direction at a side of the display element or around the display element.

In an embodiment, a depth d of the recess R may be approximately 1 μm or more. In an embodiment, the depth d of the recess R may be about 20%, 30%, or 50% with reference to the thickness t of the planarization layer 209. In some embodiments, a thickness t of the planarization layer 209 may be about 4 μm, and the depth d of the recess R may be from about 1 μm to about 2 μm. In this case, the depth d of the recess R indicates a distance from the even upper surface of the planarization layer 209 to a lower surface of the recess R, and the thickness t of the planarization layer 209 may indicate a longest distance between an upper surface of a layer (for example, the second interlayer insulating layer 207) on which the source electrode SE or the drain electrode DE of the thin film transistor TFT is arranged to the upper surface of the planarization layer 209.

In the present embodiment, the planarization layer 209 may include an organic planarization layer 209a and an inorganic planarization layer 209b arranged on the organic planarization layer 209a.

The organic planarization layer 209a may include a via hole VH that exposes the drain electrode DE of the thin film transistor TFT and may have an upper surface that is even (e.g., entirely even). The organic planarization layer 209a may include an organic insulating material, such as a general commercial polymer such as any of PMMA or PS, a polymer derivative having a phenolic group, an acrylic polymer, an imide-based polymer, an acrylether-based polymer, an amide-based polymer, a fluoride-based polymer, a p-xylene based polymer, a vinylalcohol-based polymer, and a blend thereof. For example, the organic planarization layer 209a may include polyimide.

The recess R may be provided in the inorganic planarization layer 209b. The recess R may be arranged at a side or around the organic light-emitting diode OLED which is a display element. The inorganic planarization layer 209b, which is arranged on the organic planarization layer 209a, may have an even upper surface in an area in which the organic light-emitting diode OLED is arranged.

In an embodiment, the depth d of the recess R may be approximately 1 μm or more. In an embodiment, the depth d of the recess R may be about 20%, 30%, or 50% with reference to a total thickness t of the planarization layer 209. In some embodiments, the total thickness t of the planarization layer 209 may be about 4 μm, and the depth d of the recess R may be from about 1 μm to about 2 μm. In this case, the depth d of the recess R indicates a distance from the even upper surface of the planarization layer 209 to a lower surface of the recess R, and the thickness t of the planarization layer 209 may indicate a longest distance between an upper surface of a layer (for example, the second interlayer insulating layer 207) on which the source electrode SE or the drain electrode DE of the thin film transistor TFT is arranged to the upper surface of the planarization layer 209.

The inorganic planarization layer 209b may include an inorganic insulating material, such as $SiN_x$, $SiO_x$, or SiON.

In FIG. 7, the recess R is shown as not penetrating the inorganic planarization layer 209b, but embodiments are not limited thereto. In an embodiment, the recess R may penetrate the inorganic planarization layer 209b such that the upper surface of the organic planarization layer 209a is exposed. In an embodiment, the recess R may be formed as the inorganic planarization layer 209b is penetrated and a portion of the organic planarization layer 209a may be removed in a depth direction. In other words, the recess R may have any of various concave shapes in the depth direction of an entire portion of the planarization layer 209.

In the present embodiment, as the planarization layer 209 includes the recess R, the unit organic encapsulation layer 320u included in the encapsulation layer 300 does not flow toward the penetration portion V and is arranged to correspond to the unit display portion 200, and the first inorganic encapsulation layer 310 and the second inorganic encapsulation layer 330 are in contact with each other at the perimeter of the unit organic encapsulation layer 320u. Accordingly, the encapsulation layer 300 seals each of the unit display portions 200.

Figure 8:
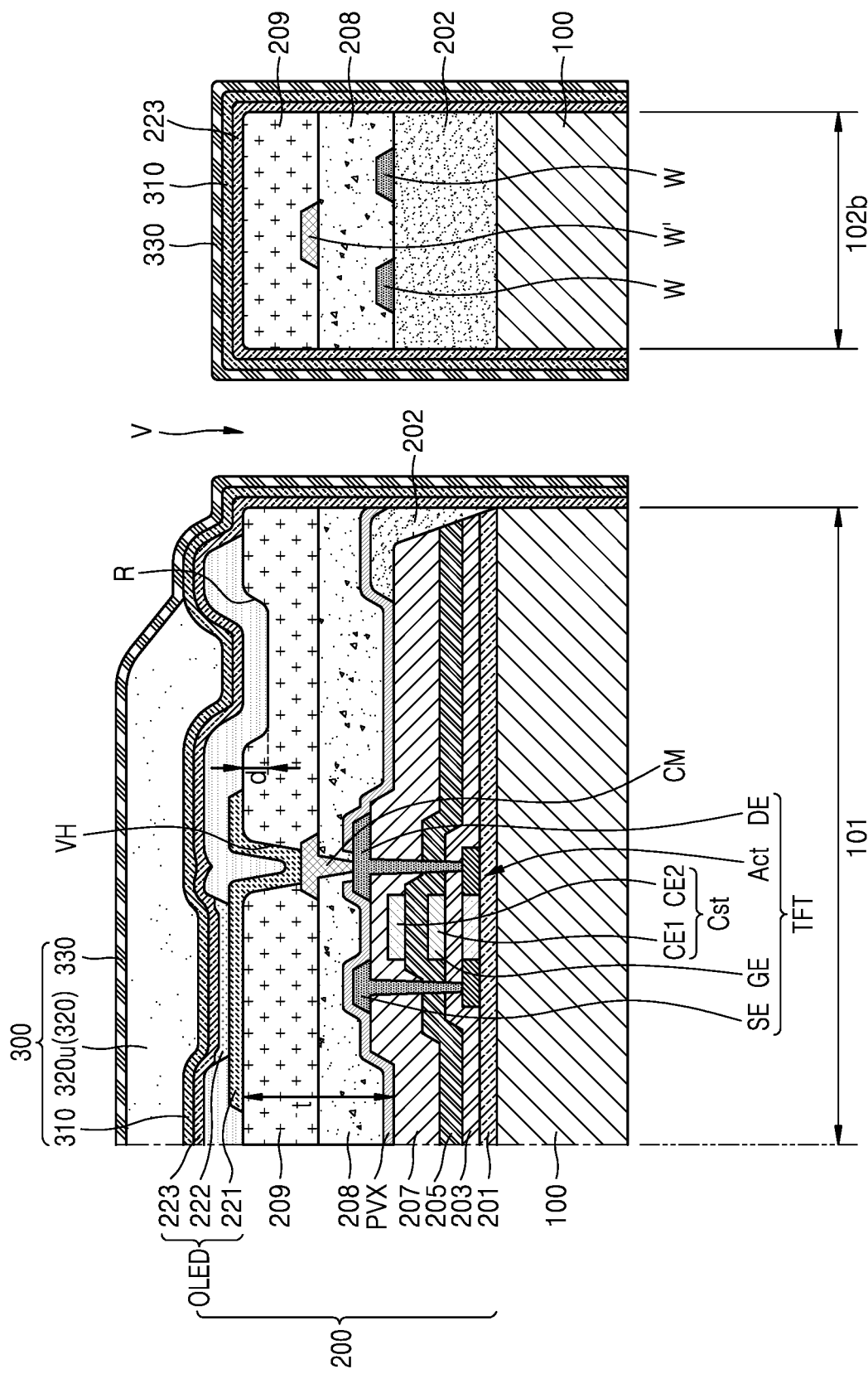
FIG. 8 is a schematic cross-sectional view showing a display apparatus according to another embodiment.

FIG. 8 is a schematic cross-sectional view showing a display apparatus according to another embodiment. FIG. 8 may correspond to the line I-I' shown in FIG. 3. In FIG. 8, like reference numerals as those of FIGS. 3 and 4 denote like components, and repeated descriptions thereof may be omitted.

Referring to FIG. 8, the display apparatus according to an embodiment includes the substrate 100, the unit display portion 200 including the planarization layer 209, and the encapsulation layer 300 sealing each of the unit display portions 200.

As shown in FIGS. 1 through 3, the substrate 100 may include the plurality of islands 101 apart from one another, the plurality of connection portions 102 that connect the plurality of islands 101, and the plurality of penetration portions V that penetrate the substrate 100 between the plurality of connection portions 102.

The unit display portions 200 are respectively arranged on the plurality of islands 101. That is, the unit display portion 200 may be a group of display elements arranged on one island 101. In an embodiment, the unit display portion 200 may include only one display element. In another embodiment, the unit display portion 200 may include a plurality of display elements representing red, green, and blue colors.

The unit display portion 200 includes the planarization layer 209, and the display element, for example, the organic light-emitting diode OLED, may be arranged on the planarization layer 209. The planarization layer 209 may provide an even upper surface in an area in which the organic light-emitting diode OLED that is a display element is arranged, and may include a recess R that is concave in the depth direction at a side of the display element or around the display element.

In the present embodiment, an inorganic protection layer PVX and a lower planarization layer 208 may be additionally arranged between the thin film transistor TFT and the planarization layer 209. In addition, the step compensation layer 202 may be arranged in a portion of the island 101 of the substrate 100.

In an embodiment, the inorganic protection layer PVX may include a single layer or a multi-layer including $SiN_x$ and $SiO_x$. The inorganic protection layer PVX may cover and protect the source electrode SE of the thin film transistor TFT and some wirings. In an embodiment, wirings (not shown) formed together in a same process with the source electrode SE may be exposed in a partial area of the substrate 100. The exposed portions of the wirings may be damaged by an etchant used in patterning of the pixel electrode 221. However, as the inorganic protection layer PVX covers at least some of the wirings in the present embodiment, the wirings may be prevented or substantially prevented from being damaged in the patterning process of the pixel electrode 221.

The lower planarization layer 208 may be arranged between the inorganic protection layer PVX and the planarization layer 209. The lower planarization layer 208 may include an organic insulating material, such as a general commercial polymer such as any of polymethyl methacrylate (PMMA) or polystyrene (PS), a polymer derivative having a phenolic group, an acrylic polymer, an imide polymer, an arylether polymer, an amide polymer, a fluorinated polymer, a p-xylene polymer, a vinyl alcohol polymer, and a blend thereof.

A connection metal CM for connecting the pixel electrode 221 and the thin film transistor TFT may be arranged on the lower planarization layer 208. In an embodiment, on the lower planarization layer 208, a wiring (not shown) may be arranged on a same layer as the connection metal CM. In an embodiment, the connection metal CM may include a conductive material including any of Mo, Al, Cu, and Ti, and may include a multi-layer or single layer including the above-described materials. As described above, as the lower planarization layer 208 is provided, the wirings may also be arranged on the lower planarization layer 208, and, accordingly, density of components in the unit display portion 200 may be enhanced.

The step compensation layer 202 may be arranged in a portion of the island 101 of the substrate 100. In an embodiment, the step compensation layer 202 may be arranged to cover side surfaces of the buffer layer 201, the gate insulating layer 203, the first interlayer insulating layer 205, and the second interlayer insulating layer 207.

In a process of removing the buffer layer 201, the gate insulating layer 203, the first interlayer insulating layer 205, and the second interlayer insulating layer 207, which are arranged on the connection portion 102b, some of the buffer layer 201, the gate insulating layer 203, the first interlayer insulating layer 205, and the second interlayer insulating layer 207 arranged on the island 101 are removed, and the step compensation layer 202 is filled in a portion from which some of the buffer layer 201, the gate insulating layer 203, the first interlayer insulating layer 205, and the second interlayer insulating layer 207 are removed. Next, the planarization layer 209, the pixel defining layer 211, and the penetration hole V may be formed.

Therefore, a portion of the step compensation layer 202 may be arranged on the island 101.

In an embodiment, a depth d of the recess R formed in the planarization layer 209 may be approximately 1 µm or more. In an embodiment, the depth d of the recess R may be about 20%, 30%, or 50% with reference to a total thickness t of the inorganic protection layer PVX, the lower planarization layer 208, and the planarization layer 209. In some embodiments, the total thickness t may be about 4 µm, and the depth d of the recess R may be from about 1 µm to about 2 µm. In this case, the depth d of the recess R indicates a distance from the even upper surface of the planarization layer 209 to the lower surface of the recess R, and the total thickness t may indicate a longest distance between the upper surface of the layer (e. g., the second interlayer insulating layer 207) on which the source electrode SE or drain electrode DE of the thin film transistor TFT is arranged to the upper surface of the planarization layer 209.

In an embodiment, the inorganic protection layer PVX may not be arranged in the connection portion 102b. In other words, the step compensation layer 202, the lower planarization layer 208, and the planarization layer 209 may be arranged in the connection portion 102b, and an extra wiring W may be arranged between the lower planarization layer 208 and the planarization layer 209.

In the present embodiment, as the planarization layer 209 includes the recess R, the unit organic encapsulation layer 320u included in the encapsulation layer 300 does not flow toward the penetration portion V and is arranged to correspond to the unit display portion 200, and the first inorganic encapsulation layer 310 and the second inorganic encapsulation layer 330 are in contact with each other at the perimeter of the unit organic encapsulation layer 320u. Accordingly, the encapsulation layer 300 seals each of the unit display portions 200.

According to embodiments, an encapsulation layer having high reliability may be realized in a display apparatus, a shape of which may be modified. However, the scope of the embodiments is not limited by the above-described effect.

It is to be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as set forth by the following claims.

What is claimed is:

1. A display apparatus comprising:
   a substrate;
   a plurality of unit display portions, each comprising a thin film transistor located on the substrate, a first display element and a second display element located over the thin film transistor, and a planarization layer located between the thin film transistor and the first display element; and
   an encapsulation layer sealing each of the plurality of unit display portions,
   wherein the planarization layer comprises a first recess and a second recess that are each concave in a depth direction so as to have a depth less than a thickness of the planarization layer, the first recess being located between an emission area of the first display element and an emission area of the second display element, an entirety of the second recess being outside a perimeter of an emission area of the plurality of unit display portions,
   the encapsulation layer comprises an organic encapsulation layer and a first inorganic encapsulation layer arranged under the organic encapsulation layer, an upper surface of the first inorganic encapsulation layer comprising a concave portion corresponding to the first recess of the planarization layer, and the organic encapsulation layer overlapping the concave portion of the upper surface of the first inorganic encapsulation layer,
   the first display element comprises a pixel electrode, an intermediate layer on the pixel electrode, and an opposite electrode on the intermediate layer, the opposite electrode overlapping an entirety of the first recess,
   the substrate comprises a plurality of islands apart from one another, a plurality of connection portions connecting the plurality of islands, and a plurality of penetration portions penetrating the substrate between the plurality of connection portions,
   the second recess is at a periphery of an island of the plurality of islands, and
   the opposite electrode is at least partially arranged on side surfaces of the plurality of penetration portions.

2. The display apparatus of claim 1, wherein the first recess at least partially surrounds the first display element.

3. The display apparatus of claim 1, wherein the first recess surrounds the first display element and the second display element.

4. The display apparatus of claim 1, wherein
   the encapsulation layer further comprises a second inorganic encapsulation layer arranged over the organic encapsulation layer,
   the organic encapsulation layer comprises unit organic encapsulation layers respectively corresponding to the plurality of unit display portions, and
   the first inorganic encapsulation layer and the second inorganic encapsulation layer are in contact with each other at a perimeter of the unit organic encapsulation layers.

5. The display apparatus of claim 4, wherein the plurality of unit display portions are respectively arranged on the plurality of islands.

6. The display apparatus of claim 5, wherein the first inorganic encapsulation layer and the second inorganic encapsulation layer are at least partially arranged on the side surfaces of the plurality of penetration portions.

7. The display apparatus of claim 5, further comprising:
   a wiring on the plurality of connection portions, wherein an electrical signal is transmitted to a unit display portion of the plurality of unit display portions via the wiring; and
   a step compensation layer arranged between the plurality of connection portions and the wiring and comprising an organic material.

8. The display apparatus of claim 1, wherein
   the pixel electrode is arranged on the planarization layer, and
   a pixel defining layer that covers an edge of the pixel electrode is arranged on the planarization layer.

9. The display apparatus of claim 8, wherein the pixel defining layer exposes the second recess.

10. The display apparatus of claim 1,
    wherein the planarization layer comprises an organic planarization layer and an inorganic planarization layer arranged on the organic planarization layer, and
    the first recess is provided in the inorganic planarization layer.

11. The display apparatus of claim 1, further comprising an inorganic protection layer arranged between the thin film transistor and the planarization layer and covering a source electrode or a drain electrode of the thin film transistor.

12. The display apparatus of claim 1,
    wherein the thin film transistor comprises at least one inorganic layer, and
    a step compensation layer is arranged on a side surface of the at least one inorganic layer, the step compensation layer comprising an organic material.

13. The display apparatus of claim 1, further comprising:
    a lower planarization layer arranged between the thin film transistor and the planarization layer; and
    a connection metal arranged on the lower planarization layer.

14. The display apparatus of claim 1, wherein the first recess and the second recess are integrally provided.

15. A display apparatus comprising:
    a substrate comprising a plurality of islands apart from one another, a plurality of connection portions connecting the plurality of islands, and a plurality of penetration portions penetrating the substrate between the plurality of connection portions;
    a plurality of unit display portions respectively arranged on the plurality of islands; and
    an encapsulation layer sealing each of the plurality of unit display portions,
    wherein each of the plurality of unit display portions comprises a thin film transistor, a first organic light-emitting diode and a second organic light-emitting diode located over the thin film transistor, and a planarization layer located between the thin film transistor and the first organic light-emitting diode,
    the planarization layer comprises a first recess and a second recess that are each concave in a depth direction so as to have a depth less than a thickness of the planarization layer, the first recess being located between an emission area of the first organic light-emitting diode and an emission area of the second organic light-emitting diode, an entirety of the second recess being outside a perimeter of an emission area of the plurality of unit display portions and is at a periphery of an island of the plurality of islands, the encapsulation layer comprises an organic encapsulation layer and a first inorganic encapsulation layer arranged under the organic encapsulation layer, an upper surface of the first inorganic encapsulation layer comprising a concave portion corresponding to the first recess of the planarization layer, and the organic encapsulation layer overlapping the concave portion of the upper surface of the first inorganic encapsulation layer, and the first organic light-emitting diode comprises a pixel electrode, an intermediate layer on the pixel electrode and comprising an organic emission layer, and an opposite electrode on the intermediate layer, the opposite electrode overlapping an entirety of the first recess and at least partially arranged on side surfaces of the plurality of penetration portions.

16. The display apparatus of claim 15, wherein the encapsulation layer further comprises a second inorganic encapsulation layer arranged over the organic encapsulation layer, the organic encapsulation layer comprises unit organic encapsulation layers respectively corresponding to the plurality of unit display portions, and the first inorganic encapsulation layer and the second inorganic encapsulation layer are in contact with each other at a perimeter of the unit organic encapsulation layers.

17. The display apparatus of claim 16, wherein the first inorganic encapsulation layer and the second inorganic encapsulation layer are in contact with each other on the plurality of connection portions.

18. The display apparatus of claim 16, wherein the first inorganic encapsulation layer and the second inorganic encapsulation layer are at least partially arranged on the side surfaces of the plurality of penetration portions.

19. The display apparatus of claim 15, wherein the pixel electrode is arranged on an upper surface of the planarization layer, and a pixel defining layer that covers an edge of the pixel electrode is arranged on the planarization layer and does not overlap the second recess.

20. The display apparatus of claim 15, further comprising:

a wiring on the plurality of connection portions, wherein an electrical signal is transmitted to the plurality of unit display portions via the wiring; and a step compensation layer arranged between the plurality of connection portions and the wiring and comprising an organic material.

21. The display apparatus of claim 15, wherein the first recess and the second recess are integrally provided.

* * * * *